(12) United States Patent
Greiser et al.

(10) Patent No.: US 9,547,059 B2
(45) Date of Patent: Jan. 17, 2017

(54) METHOD FOR A RAPID DETERMINATION OF SPATIALLY RESOLVED MAGNETIC RESONANCE RELAXATION PARAMETERS IN AN AREA OF EXAMINATION

(71) Applicants: Andreas Greiser, Erlangen (DE); Peter Schmitt, Weisendorf (DE); Hui Xue, Franklin Park, NJ (US)

(72) Inventors: Andreas Greiser, Erlangen (DE); Peter Schmitt, Weisendorf (DE); Hui Xue, Franklin Park, NJ (US)

(73) Assignee: Siemens Aktiengesellschaft, Munich (DE)

( * ) Notice: Subject to any disclaimer, the term of this patent is extended or adjusted under 35 U.S.C. 154(b) by 865 days.

(21) Appl. No.: 13/866,328

(22) Filed: Apr. 19, 2013

(65) Prior Publication Data

US 2013/0278259 A1 Oct. 24, 2013

(30) Foreign Application Priority Data

Apr. 20, 2012 (DE) .......................... 10 2012 206 585

(51) Int. Cl.
*G01V 3/00* (2006.01)
*G01R 33/50* (2006.01)
*G01R 33/56* (2006.01)
*G01R 33/565* (2006.01)

(52) U.S. Cl.
CPC .............. *G01R 33/50* (2013.01); *G01R 33/56* (2013.01); *G01R 33/56509* (2013.01)

(58) Field of Classification Search
CPC ...................................................... G01R 33/56
USPC .......................................... 324/306, 307, 309
See application file for complete search history.

(56) References Cited

U.S. PATENT DOCUMENTS

| 8,874,192 | B2 * | 10/2014 | Hundley et al. ............... 600/411 |
| 9,008,753 | B2 * | 4/2015 | Messroghli ................... 600/413 |
| 2002/0016543 | A1 | 2/2002 | Tyler | |
| 2003/0065258 | A1 * | 4/2003 | Gupta et al. .................. 600/410 |
| 2005/0148852 | A1 | 7/2005 | Tank | |
| 2005/0200356 | A1 | 9/2005 | Hennig | |
| 2007/0080690 | A1 | 4/2007 | Takei et al. | |
| 2007/0088212 | A1 | 4/2007 | Takei et al. | |
| 2010/0026299 | A1 | 2/2010 | King et al. | |

(Continued)

OTHER PUBLICATIONS

Mäkelä et al. "A review of cardiac image registration methods"; IEEE Transactions on Medical Imaging; vol. 21; No. 9; pp. 1011-1021; (2002).

(Continued)

*Primary Examiner* — Louis Arana
(74) *Attorney, Agent, or Firm* — Schiff Hardin LLP

(57) ABSTRACT

In a method for a rapid determination of spatially resolved magnetic resonance relaxation parameters in an area of examination, a preparation pulse is radiated into the area of examination. During the relaxation of the longitudinal magnetization, spatially encoded magnetic resonance signals are acquired at a minimum of two different points in time using a fast magnetic resonance sequence. At each inversion time, an image data record is reconstructed from the magnetic resonance signals, which are elastically registered to each other. From the recorded image data records, values of magnetic resonance relaxation parameters are spatially accurately determined.

15 Claims, 3 Drawing Sheets

(56) References Cited

U.S. PATENT DOCUMENTS

| | | |
|---|---|---|
| 2010/0301860 A1 | 12/2010 | Kim et al. |
| 2010/0301861 A1 | 12/2010 | Pittaluga et al. |
| 2011/0199082 A1 | 8/2011 | Kimura |
| 2012/0043964 A1 | 2/2012 | Schreck et al. |
| 2012/0189183 A1* | 7/2012 | Xue et al. ............... 382/131 |
| 2013/0272591 A1* | 10/2013 | Xue et al. ............... 382/131 |
| 2015/0342496 A1* | 12/2015 | Greiser et al. |

OTHER PUBLICATIONS

Shi et al.; "Single-Shot T1 Mapping Using Simultaneous Acquisitions of Spin- and Stimulated-Echo-Planar Imaging (2D ss-SESTEP1)"; Magnetic Resonance in Medicine; vol. 64; pp. 734-742; (2010).

Meng et al.; "A Single-Scan T2* Mapping Method Based on Two Gradient-Echo Images with Compensation for Macroscopic Field Inhomogeneity"; Magnetic Resonance in Medicine; vol. 60; pp. 1388-1395; (2008).

Jahng et al.; "Sensitive and fast T1 mapping based on two inversion recovery images and a reference image"; Med. Phys.; vol. 32 (6); pp. 1524-1528; (2005).

Messroghli et al: "Modified Look-Locker inversion recovery (MOLLI) for high-resonlution T1 mapping of the heart", in: Magn. Reson. Med., vol. 52, Nr. 1, S. pp. 141-146; (2004).

Schmitt et al: "Inversion Recovery TrueFISP: Quantification of T1, T2,and Spin Density", Magnetic Resonance in Medicine 51: pp. 661-667 (2004).

Hui et al: "Motion Correction for Myocardial T1 Mapping Using Image Registration with Synthetic Image Estimation", Magnetic Resonance in Medicine, OnLline Library (2011).

Greiser et al: "Cardiac Motion-Corrected Inversion Prepared Real-Time ("TIRT") Cine TrueFISP Imaging for Rapid Myocardial T1 Estimation", SMRM p. 5473 (2012).

Messroghli et al. "Optimization and Validation of a Fully-Integrated Pulse Sequence for Modified Look-Locker Inversion-Recovery (MOLLI) T1 Mapping of the Heart"; Journal of Magnetic Resonance Imaging 26; pp. 1081-1086, (2007).

\* cited by examiner

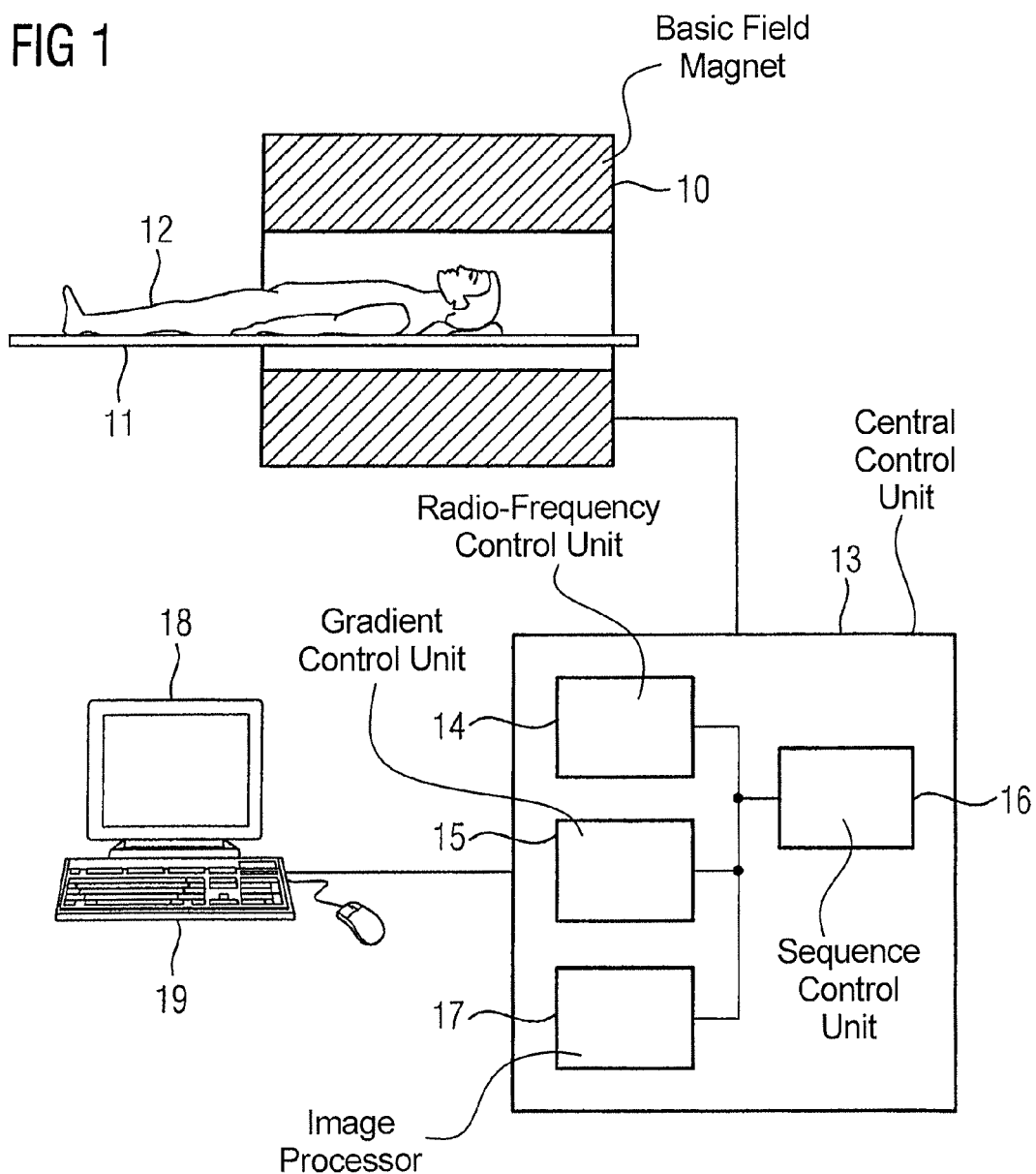

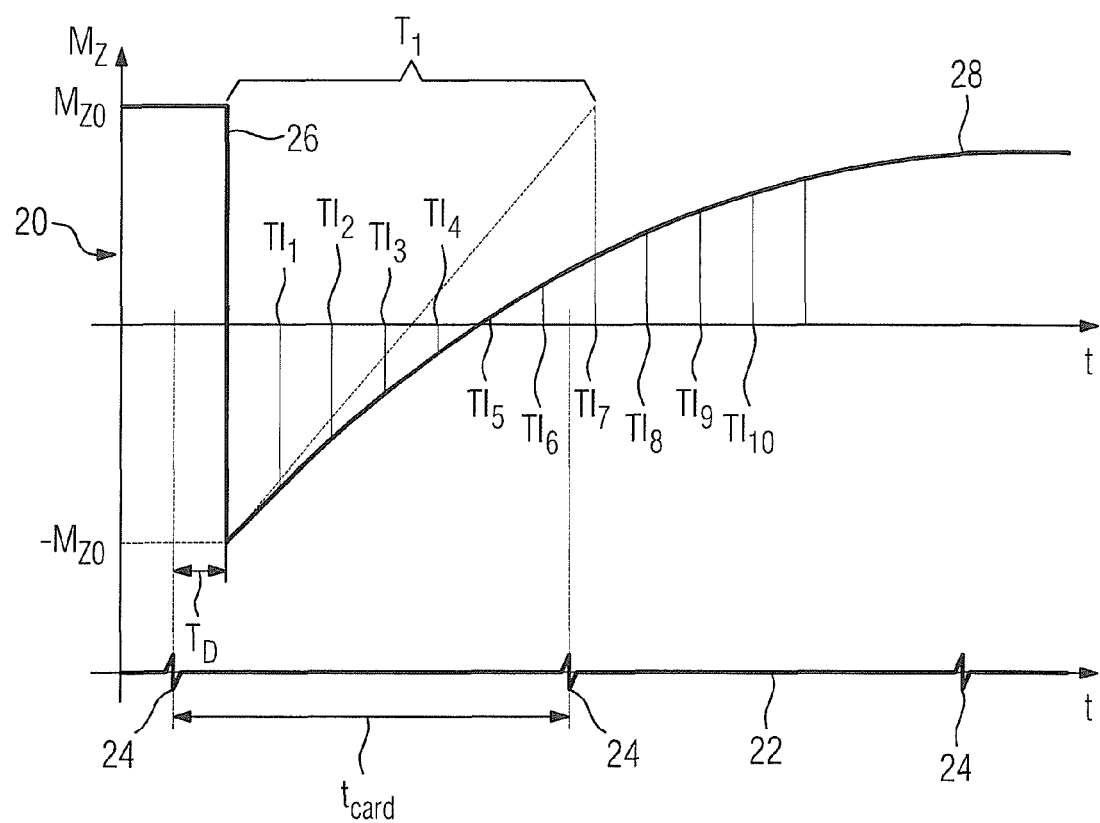

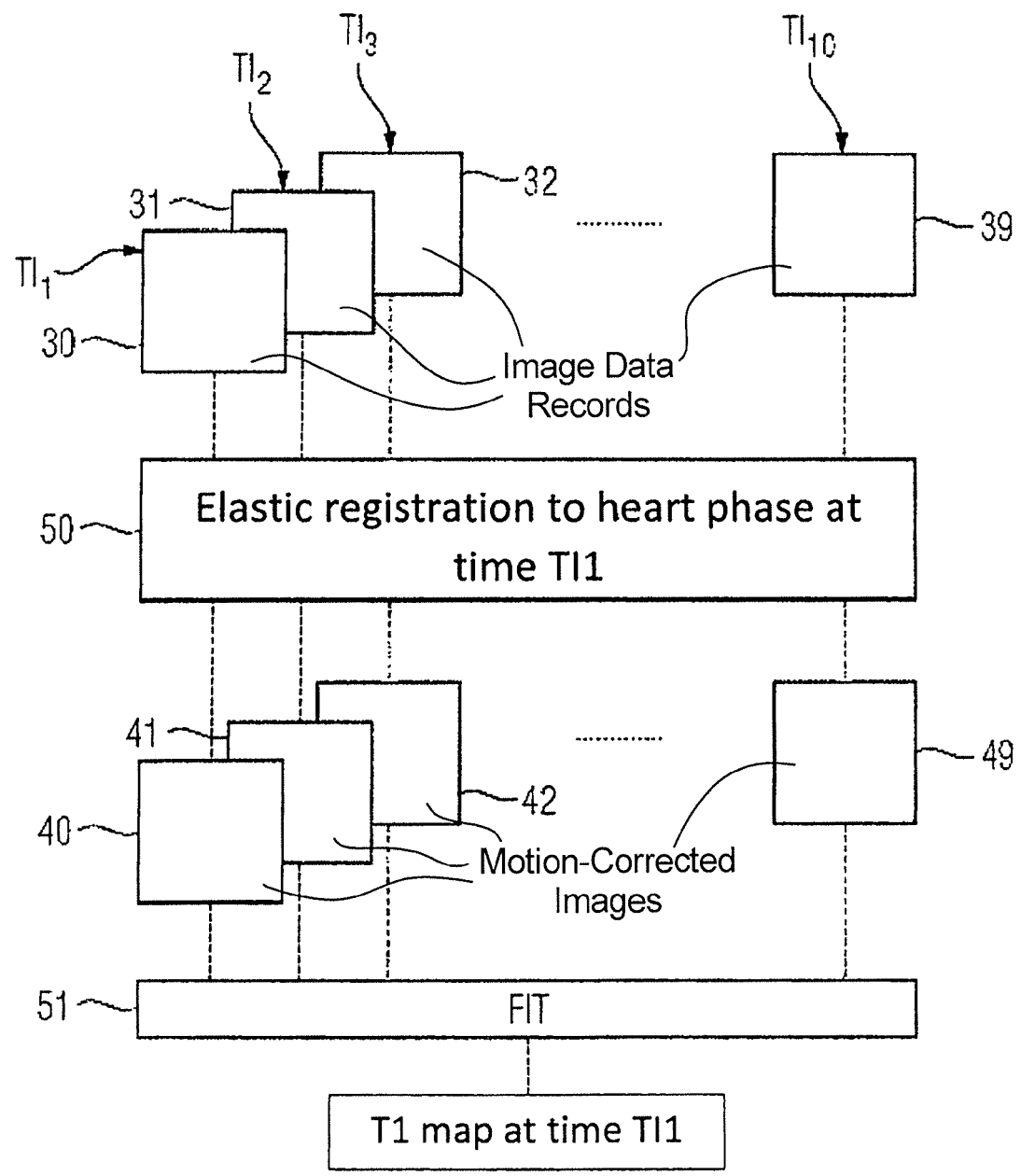

METHOD FOR A RAPID DETERMINATION OF SPATIALLY RESOLVED MAGNETIC RESONANCE RELAXATION PARAMETERS IN AN AREA OF EXAMINATION

BACKGROUND OF THE INVENTION

Field of the Invention

The invention concerns a method for a rapid determination of a spatially resolved magnetic resonance relaxation parameter in one area of examination, such as the longitudinal relaxation constants T1 and the transverse relaxation constants T2.

Description of the Prior Art

Medical magnetic resonance imaging is useful in the diagnosis of soft tissue due to the high contrast especially for imaging of different tissues or for the visual representation of the state of the tissue. The spatially resolved determination of the value of magnetic resonance relaxation parameters, such as the longitudinal relaxation constant T1 or the transverse relaxation constant T2, has also an added importance in medical magnetic resonance technique, because it allows to diagnose different tissues or to identify abnormal tissue changes. The spatially resolved and quantified relaxation parameters are represented in the form of parameter maps and are thus a useful demonstration tool in the diagnosis.

Particularly in the diagnosis of diseases of the heart tissue, quantitative methods for the determination of the relaxation parameter have increasingly gained in importance. Of importance in this context is the quantitative determination of the longitudinal relaxation constant T1.

However, the determination of the T1 constant of the heart tissue is a major challenge due to cardiac and respiratory movement. This is even more difficult for long T1 relaxation constants, as they typically occur in the cardiac tissue before the administration of a contrast agent. Depending on the data acquisition technique, irregular heart and respiratory cycles represent a further complication in determining the T1 constant. This is so because, for a precise quantification of T1 constants, we must know the longitudinal magnetization. If the repetition time is too short, before a new excitation, the longitudinal magnetization has not completely returned to its original position. The effective repetition time, which with heart rate-triggered data recording is determined by the heart rate, must then be taken into account.

Known methods for T1 quantification in cardiac tissue detect the magnetic resonance data in a breath hold phase over several cardiac cycles. Here, several inversion pulses triggered are irradiated into the imaged area, which is then followed by an acquisition phase and a recovery phase of the longitudinal magnetization.

The publication of Daniel R. Messroghli et al. "Modified Look-Locker Inversion Recovery (MOLLI) for High-Resolution T1 Mapping of the Heart", published in Magnetic Resonance in Medicine 52:141-146 (2004), describes a process in which a special interlocking nested acquisition scheme is applied to obtain magnetic resonance data with different inversion times. The acquisition schedule is triggered by the heart rate so that the data can always be obtained from the same heart phase, i.e., from the same state of motion of the heart.

While the special data acquisition scheme in MOLLI can, to a large degree, avoid motion artifacts arising due to the cardiac motion, there can still arise motion artifacts if the patient, who is being examined during the data acquisition, does not completely stop breathing. The motion artifacts prevent an accurate determination of the T1 constants, because at least two measurements must be taken from the same voxel (as the image data "pixel") at different times during the relaxation.

A method for motion correction of MOLLI-acquired data for T1 mapping of cardiac tissue is described in Hui Xue et al. in the publication "Motion Correction for Myocardial T1 Mapping Using Image Registration with Synthetic Image Estimation", published online in Magnetic Resonance in Medicine on 29 Aug. 2011. The described motion correction is based on the estimate of synthetic images that have a similar contrast as the originally acquired images. Here, the image contrast, which changes as a result of the relaxation and the movement, is formulated as a joint estimation problem. Using an iterative process and an initial estimate of T1 (T1 start value), a sequence of movement-corrected synthetic inversion recovery (IR) images are generated. With the initial estimate of T1, synthetic images are calculated for each inversion time. The synthetic images are then created all at a particular breathing position and have a similar contrast as the originally measured images. They are therefore suitable for an intensity-based image registration. This method is described for the correction of respiratory motion.

The known methods for spatially resolved determination of relaxation parameters of a beating heart are performed over several heartbeats, and thus require a relatively long measurement time.

SUMMARY OF THE INVENTION

An object of the invention is to provide a rapid method for spatially resolved determination of a relaxation parameter in an area of examination.

The above object is inventively achieved by a method wherein a preparation pulse is radiated into an area of examination. During the relaxation of the longitudinal magnetization, at a minimum of two different inversion times, using a fast magnetic sequence spatially encoded magnetic resonance signals are acquired. An image data record is then reconstructed from the magnetic resonance signals for each inversion time. The reconstructed image data records are elastically registered to one another, and from the registered image data records, the locally accurate relaxation parameter is determined.

The invention is based on the surprising finding that, despite the large deformations within the area of examination, a motion correction is still sufficiently accurately feasible in order to determine the values of a magnetic resonance relaxation parameter in individual locations within the area of examination.

In an embodiment, an inversion pulse is applied as a preparation pulse. The inversion pulse tilts the equilibrium magnetization into the opposite direction. Thus, during the relaxation there is available a large dynamic range for the subsequent detection of the magnetic resonance signals.

In an alternative preferred embodiment, a saturation pulse is irradiated into the area of examination as a preparation pulse. In this manner, the same initial value for the relaxation is present after every preparation pulse. This allows to avoid image artifacts or incorrect values at the quantification due to different waiting times after the previous preparation.

The present invention allows the magnetic resonance data or images to be captured (acquired) virtually continuously over the cardiac cycle. A special positioning of the acquisition in a particular cardiac phase as done in MOLLI becomes obsolete. The thus-acquired magnetic resonance data are then subjected to a post-processing in that the heart movement is corrected by a subsequent registration of the image data obtained at different times.

Also advantageous is the use of accelerated imaging techniques, such as an iterative reconstruction, parallel imaging, radial scanning, etc. in the so-called single-shot imaging techniques. This technology makes also possible to compensate for motion artifacts due to a variable heart rate during the imaging.

Especially valuable for diagnosis at cardiac imaging is the so-called T1 mapping. The longitudinal relaxation time T1 represents in the late gadolinium enhancement technique a measure of damage to the heart tissue.

In case of a fast measurement, it is possible to acquire the magnetic data not segmented, i.e., composed over several heart beats, but rather at a time in just one heartbeat. In this further advantageous embodiment of the invention, cardiac cycle magnetic resonance relaxation parameter maps are successively generated, which are then displayed as a "real-time T1 mapping". If prolonged T1 constants are available in the area of examination, a few cardiac cycles are sufficient.

A further advantage is that the starting point of the data acquisition window within the cardiac cycle may be placed in the phase of only a slight cardiac motion. Thus, especially the important magnetic resonance data of short inversion times end up in the diastole, and are thus affected by the heart motion as little as possible. In addition, magnetic resonance data that are considered imperfect due to a defective movement correction, can be ignored in the further processing. The criterion for this can result both from the heart phase information and from the motion correction process.

Advanced diagnostics result from a further embodiment, where the image data records are individually registered to each other for each cardiac phase, and locally accurate values of magnetic resonance relaxation parameters are determined for each cardiac phase. Thus, a T1 card is provided for each cardiac phase. This "beating T1-map" shows the change in time of the T1 card in the form of a cine display with the contrast of the reference-T1 card. This cine display can be superior to a stationary T1 card with respect to the information content, for example, when it comes up to interpreting the T1 values of pixels at the boundary of the heart wall, which may be differently contaminated due to the fact of the changing wall thickness and the movement over the cardiac cycle caused by partial volume effects.

In a further embodiment, the spatially resolved relaxation constant from the "Registration cardiac phase" and the information about the cardiac motion from the registration step are used—so to speak, it is an inversion in the computation how one moves from the individual measured motion states to the "Registry cardiac phase"—in order to produce a succession of superposed T1 maps with the anatomy of the beating heart. Under "Registry cardiac phase" is meant the state of motion of the heart, to which all the other cardiac phases were brought by means of motion correction.

Another result of the registration of the data of the various heart phases is the provision of individual synthetic TI images of virtually any cardiac phase, e.g., a comparison of TI images of the systole and diastole. The rationale is that in a particular inversion time TI images can be advantageous for the assessment of pathologies, such as the zero passing of the blood with the late gadolinium enhancement method, and that the method provides the possibility of generating this contrast quasi synthetically over the whole cardiac cycle, without having to have it directly measured.

The values obtained and quantified by means of a True-FISP sequence generally differ from the actual values of the free relaxation. The TrueFISP sequence has a mixed contarsts dependent on T1 and T2. Once determined, the mixed contrast can be corrected using, for example, the procedure described by Peter Schmitt et al. in the article "Inversion Recovery TrueFISP: Quantification of T1, T2, and spin density". The article was published in Magnetic Resonance in Medicine 51:661-667 (2004). In the article it is shown that from the mixing contrast it is possible to determine both the pure T1 constant and the pure T2 constant. This makes it also possible to determine T2 maps, i.e., spatially resolved T2 values, and provide their representation. Furthermore, pure proton density maps can be created from the magnetic resonance data.

Another advantage in the application of the present invention is that from the spatially resolved T1 values, one can calculate again the inversion time, at which the healthy tissue generates the weakest signal. This inversion time, which is also referred to as an optimum inversion time, is important in the context of late-gadolinium enhancement technique (LGE technique). The inversion time is obtained from the zero passing of the longitudinal magnetization in the relaxation. This allows to omit the otherwise used TI Scout measurement, which is usually designed as a segmented inversion recovery cine sequence.

BRIEF DESCRIPTION OF THE DRAWINGS

FIG. 1 shows an overview of the main functional units of a diagnostic magnetic resonance apparatus for implementing the invention.

FIG. 2 shows an embodiment of a sequence diagram.

FIG. 3 shows an overview explaining the elastic registration.

DESCRIPTION OF THE PREFERRED EMBODIMENTS

FIG. 1 shows schematically a diagnostic magnetic resonance apparatus, with which magnetic resonance relaxation parameter maps can be generated. Magnetic resonance relaxation parameter maps show, spatially correctly, the regional distribution of the values of magnetic relaxation constants an area of examination. With the so-called late-gadolinium enhancement examinations (LGE examinations) of the heart is of particular interest the regional distribution of the longitudinal relaxation constant T1.

The magnetic resonance apparatus has a basic field magnet 10 for the generation of a polarizing field $B_0$, wherein a person 12 to be examined is supported on a table 11 and is moved into the center of the magnet 10 so that spatially encoded magnetic resonance signals can be received from the area of examination. Radiation of radio-frequency pulse sequences and switching of magnetic field gradients allow the magnetization of the nuclear spins to be tilted ("flipped") out of the alignment produced by the polarizing field $B_0$. The tilted magnetization induces magnetic resonance signals in receiving coils (which are not shown). The general operation to generate magnetic resonance signals with different acquisition sequences is in principle known to those skilled in the art, so that a detailed explanation of the individual device components is not needed herein.

The magnetic resonance apparatus further has a central control unit 13, which controls the magnetic resonance apparatus and that has a radio-frequency control unit 14, a magnetic field gradient control unit 15 and a sequence control unit 16. The sequence control unit controls the sequence of the radiated radio-frequency pulses and the switching of the magnetic field gradients as a function of the desired signal contrast and the set acquisition sequence. An image processor 17 calculates from the detected magnetic resonance signals, as is well known, magnetic resonance imaging or also spatially resolved various characteristics of the examined object, such as a regional distribution of the T1 relaxation constant. The anatomical information and the characteristics can be displayed in correct spatial relation on a display unit 18 of the magnetic resonance apparatus. The magnetic resonance apparatus can be controlled by an operator using an input unit 19.

The T1 relaxation constant characterizes the relaxation of the longitudinal magnetization after a deflection by a corresponding radio-frequency excitation. If the high-frequency excitation occurs such that the longitudinal magnetization is flipped into the position opposite to the equilibrium magnetization, it is called inversion pulse or 180° pulse. The inversion pulse prepares the magnetization for a subsequent imaging sequence.

FIG. 2 shows an embodiment of a pulse diagram according to the present invention, as applied for the quantification of the values of the T1 relaxation constant. FIG. 2 is divided into an upper diagram 20 and a lower panel 22. The lower graph shows the time course of cardiac activity, characterized by the QRS complex 24. The distance between the individual QRS complexes 24 characterizes one heart period or one heart cycle tCard. The upper graph 22 shows, as an example and as a function of time, the timing of the acquisition of spatially encoded magnetic resonance signals during the relaxation of the longitudinal magnetization after excitation. The method for the rapid determination of the spatially resolved magnetic resonance relaxation parameters T1 begins with the irradiation of a 180° high-frequency pulse or an inversion pulse 26 into the area of examination, which in this case is the layer in the heart to be imaged. This point in time is seen in the upper graph 20 by the inversion of the longitudinal equilibrium magnetization Mz0 in the area of examination into the opposite direction −MZ0. After the inversion with the longitudinal relaxation constant T1, the longitudinal magnetization returns to the equilibrium position. The relaxation process is also referred to as the inversion recovery and proceeds according to an exponential function; the course of relaxation is characterized in the upper diagram by the reference numeral 28. At the inversion time TI1, first spatially encoded magnetic resonance signals are acquired with a fast imaging sequence, from which is then reconstructed a first image data record of the excited layer. A gradient echo sequence such as a single-shot True-FISP sequence is particularly suitable as a fast imaging sequence. With a slice thickness of 8 mm one can achieve a resolution of about 2×2 mm². The echo time TE is then, for example, 1 ms, and the repetition time is, for example, 2.3 ms. The rapid imaging sequence is then repeated at the inversion times TI2, TI3, etc. until TI10. At each inversion time TI1 to TI10, data image records are then reconstructed from the corresponding magnetic resonance data. Ten magnetic resonance images thus occur at different cardiac phases with different contrast due to different longitudinal magnetization. It can also be seen in FIG. 2 that magnetic resonance signals are acquired at the inversion times TI5 and TI6 in the area of strong cardiac motion. These magnetic resonance signals can be discarded, because even then there is still a sufficient amount of magnetic data or image data for the quantification of the T1 relaxation constant.

The inversion pulse may be started being triggered by means of an ECG signal. The delay time TD can be pre-set by a user. Thus, the user determines the acquisition window, in particular the starting point of the acquisition window, within the cardiac cycle. Advantageously, the acquisition window is positioned so that the acquisition of the relevant data occurs in the phases with only slight movement of the heart.

Instead of an inversion pulse 26 as described above, a saturation pulse can be radiated into the area of examination. Then, the relaxation begins in an exponential curve not from −MZ0, but rather from zero.

FIG. 3 is intended to illustrate the further processing of the reconstructed image data records 30 to 39 at individual inversion times TI1 to TI10. In addition to the different contrast between the individual image data records 30 to 39, there are also deformations due to heart movement, which prior to a pixel-by-pixel analysis require a movement correction 50 by means of an elastic registration of the individual image data records 30 to 39. A suitable method for motion correction is described in the aforementioned publication by Hui Xue et al. This process produces, with the aid of synthetic images, motion-corrected images 40 to 49 in that by starting from an initial estimated value of T1, an energy function is minimized for each pixel using an iterative process. The movement correction 50 can be applied to a given cardiac phase as the reference. For example, here all image data records 30 to 39 have been registered for the cardiac phase available at the inversion time TH. Thus motion-corrected images 40 to 49 are available for the quantification of the longitudinal relaxation constant T1. The quantification itself is done by means of a fit method 51, assuming an exponential function curve, whose parameters—the amplitude and the relaxation constant T1—are determined so that the error of all motion-corrected images 40 to 49 is a minimum. The quantification of the longitudinal relaxation constant T1 requires at least two different image data records, e.g., the motion-corrected images 40 and 49. However, to minimize errors it is appropriate to perform the quantification from more than two different movement-corrected image data records.

If one applies the motion correction also to other reference cardiac phases, e.g., the cardiac phases at the inversion times TI2, TI3, etc., one can produce for these inversion times TI1, TI2, TI3, etc. the so-called cine images, with which the movement of the heart can be represented in the form of a motion study based on the change of the T1 values.

Since all relevant magnetic resonance signals are acquired in one or at most only a few cardiac cycles, there is also the possibility to create a real-time T1 mapping or T1 maps in real time and display them.

The accuracy of the relaxation parameters determined by the above method by using a TrueFISP sequence can be further improved in that the influence of the applied flip angle, the echo time TE and the repetition time TR on the relaxation is considered. A suitable correction procedure is described in the article "Inversion recovery TrueFISP: Quantification of T1, T2, and spin density," by Peter Schmitt et al., published in Magnetic Resonance in Medicine 51:661-667 (2004).

The above-described embodiment of the invention makes possible a high-speed data acquisition, which requires only short breathing stop times. This method is so powerful that, if need be, the data acquisition may be performed during free breathing. Since the data acquisition window extends substantially only over one cardiac cycle, the data acquisition is also insensitive to cardiac arrhythmia.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for rapid determination of spatially resolved magnetic resonance (MR) relaxation parameters in an examination region, comprising:

operating a magnetic resonance data acquisition unit to radiate a radio-frequency preparation pulse into an examination area of a subject in the data acquisition unit, thereby producing relaxation of longitude in all magnetization of nuclear spins in the examination area;

during the relaxation of the longitudinal magnetization, operating said MR data acquisition unit to acquire spatially encoded MR signals originating from said nuclear spins at a minimum of two different inversion times, according to a fast magnetic resonance data acquisition sequence;

at any of said inversion times, reconstructing an image data record from the MR signals;

in a processor, elastically bringing at least two of said image data records into registration with each other, thereby producing registered image data records; and in said processor, identifying, from the registered image data records, MR relaxation parameters in a spatially correct relationship, and making said MR relaxation parameters available in electronic form at an output of said processor.

2. A method as claimed in claim 1 comprising radiating said preparation pulse as an inversion pulse.

3. A method as claimed in claim 1 comprising radiating said preparation pulse as a saturation pulse.

4. A method as claimed in claim 1 comprising using the longitudinal relaxation constant T1 as said magnetic resonance relaxation parameter.

5. A method as claimed in claim 1 comprising using the transverse relaxation constant T2 as said magnetic resonance relaxation parameter.

6. A method as claimed in claim 1 comprising employing a gradient echo sequence as said fast magnetic resonance sequence.

7. A method as claimed in claim 6 comprising employing a TrueFISP sequence as said gradient echo sequence.

8. A method as claimed in claim 1 comprising acquiring said MR signals during one cardiac cycle of the examination subject.

9. A method as claimed in claim 1 comprising bringing said at least two image data sets into registration elastically by implementing a synthetic estimation of each of said image data records, with each synthetic estimation of an image data record being determined in an iterative process from the respective image data record.

10. A method as claimed in claim 1 comprising successively, at each cardiac cycle of the examination subject, generating magnetic resonance relaxation parameter maps, and displaying said maps in real time.

11. A method as claimed in claim 10 comprising bringing said image data records into registration elastically for each inversion time, and generating said MR relaxation parameters for each inversion time.

12. A method as claimed in claim 11 comprising generating a synthetic image data record for each cardiac phase in each cardiac cycle that exhibit a predetermined target contrast.

13. A method as claimed in claim 12 comprising, for each inversion time, displaying the MR parameters together with the respective image data records.

14. A method as claimed in claim 13 comprising displaying the MR parameters superimposed with said image data records.

15. A method as claimed in claim 1 comprising, in said processor, from said values of said MR relaxation parameters, generating an MR relaxation parameter map.

* * * * *